United States Patent
Kanda

(10) Patent No.: US 7,180,293 B2
(45) Date of Patent: Feb. 20, 2007

(54) MRI APPARATUS

(75) Inventor: Kenichi Kanda, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 11/269,035

(22) Filed: Nov. 8, 2005

(65) Prior Publication Data

US 2006/0097723 A1    May 11, 2006

(30) Foreign Application Priority Data

Nov. 8, 2004  (JP) .............................. 2004-323261

(51) Int. Cl.
*G01V 3/00* (2006.01)
(52) U.S. Cl. ...................... 324/318; 324/309
(58) Field of Classification Search ............... 324/318, 324/319, 322, 309, 307, 300; 600/410, 412, 600/420, 422
See application file for complete search history.

(56) References Cited

U.S. PATENT DOCUMENTS

| | | | |
|---|---|---|---|
| 4,297,637 A | | 10/1981 | Crooks et al. |
| 4,549,139 A | * | 10/1985 | MacFall et al. ............. 324/309 |
| 4,549,140 A | | 10/1985 | MacFall |
| 5,412,322 A | * | 5/1995 | Wollin ........................ 324/318 |
| 5,529,068 A | * | 6/1996 | Hoenninger et al. ........ 600/413 |
| 6,294,914 B1 | * | 9/2001 | Fiat ............................. 324/312 |
| 6,727,697 B2 | * | 4/2004 | Fiat ............................. 324/307 |
| 7,034,532 B1 | * | 4/2006 | Shenoy ....................... 324/309 |
| 2002/0011842 A1 | | 1/2002 | Fiat |

FOREIGN PATENT DOCUMENTS

JP             3513076             10/2001

* cited by examiner

*Primary Examiner*—Brij B. Shrivastav
(74) *Attorney, Agent, or Firm*—Carl B. Horton, Esq.; Armstrong Teasdale LLP

(57) ABSTRACT

For the purpose of providing an MRI apparatus which gives rise to no phase deviation due to frequency alteration of the RF magnetic field and signals for detection use, the MRI apparatus includes: signal collecting means which detects and collects magnetic resonance signals generated by applying a magnetostatic field, a gradient magnetic field and an RF magnetic field onto an object; frequency altering means which alters the frequency of the RF magnetic field and the frequency of signals for detection use in accordance with change in the Larmor frequency with time; and image reconstructing means which reconstructs an image on the basis of the collected signals, and further comprises: phase control means which sets as the phase at the time of starting detection of signals for detection use a phase $\Delta\theta$ given by a relational expression $\Delta\theta = 2\pi \cdot \Delta f \cdot T$ using the difference $\Delta f$ between the frequency altered by the frequency altering means and a reference frequency, and a time period T from the start of applying the RF magnetic field to the start of detection of magnetic resonance signals.

12 Claims, 7 Drawing Sheets

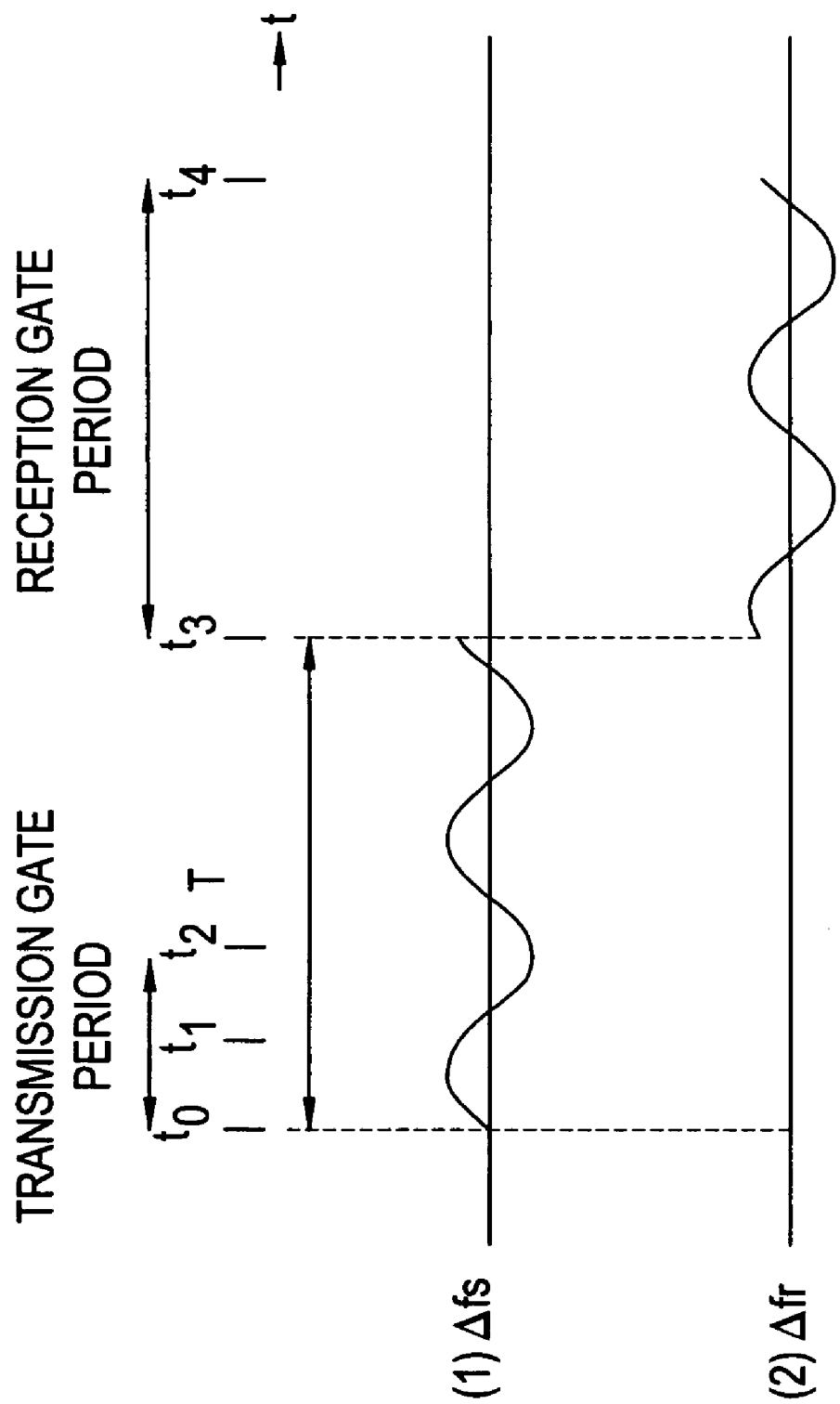

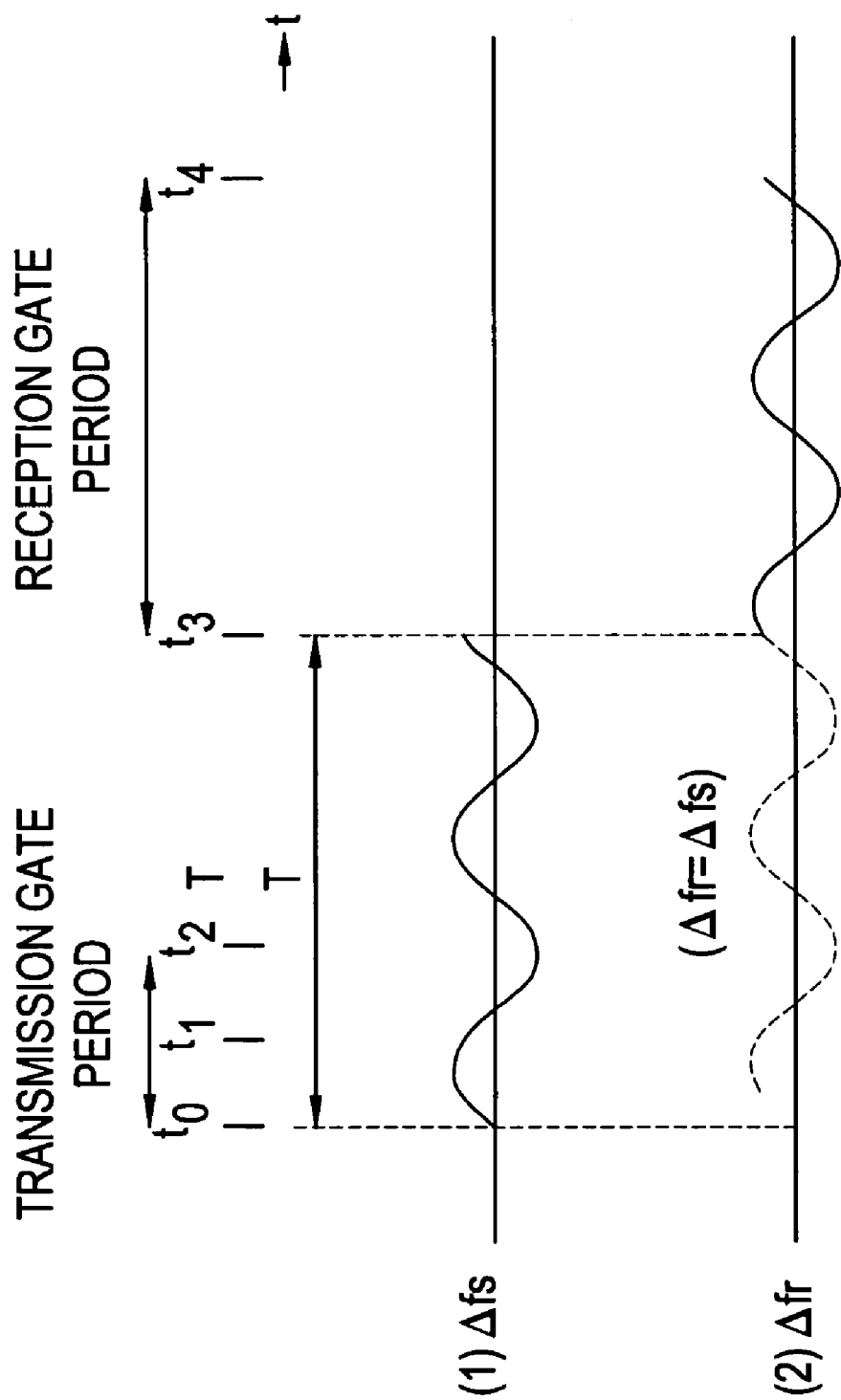

MRI APPARATUS

CROSS REFERENCE TO RELATED APPLICATIONS

This application claims the benefit of Japan Application No. 2004-32326 1 filed Nov. 8, 2004.

The present invention relates to an MRI (Magnetic Resonance Imaging) apparatus, and more particularly to an MRI apparatus which alters the frequency of the RF (radio frequency) magnetic field and the frequency signals for detection use in accordance with change in the Larmor frequency with time and collects magnetic resonance signals.

In an MRI apparatus the Larmor frequency may vary with time as a consequence of a variation in magnetostatic field intensity or the like, and in such a case the frequency of the RF magnetic field and the frequency of signals for detection use are altered in accordance with the variation of the Larmor frequency. The Larmor frequency is measured from FID (Free Induction Decay) signals or the like collected at suitable timings, the frequency of the RF magnetic field and the frequency of signals for detection use are corrected according to the extent of variation from the initial value (see Patent Document 1 for instance).

[Patent Document 1] Specification of Japanese Patent No. 3513076, pp. 5–7, FIGS. 1 through 5).

The frequency alteration of the RF magnetic field is performed at the time of starting the transmission of RF pulses, and the frequency alteration of signals for detection use is performed at the time of starting detection. Whereas both frequencies are altered in an initial phase of 0, the signals obtained by detection differ in phase from the detection signals obtained when there is no change in the Larmor frequency. Such a deviation in phase gives rise to an error in differential computation, for instance, of signals of the same region differing in the time of collection at a raw data stage.

SUMMARY OF THE INVENTION

Therefore, an object of the present invention is to provide an MRI apparatus which is free from phase deviation due to the alteration of the frequencies of the RF magnetic field and signals for detection use.

One aspect of the invention to solve the problem noted above constitutes an MRI apparatus including: signal collecting means which detects and collects magnetic resonance signals generated by applying a magnetostatic field, a gradient magnetic field and an RF magnetic field onto an object; frequency altering means which alters the frequency of the RF magnetic field and the frequency of signals for detection use in accordance with change in the Larmor frequency with time; and image reconstructing means which reconstructs an image on the basis of the collected signals, the MRI apparatus comprising:

phase control means which sets as the phase at the time of starting detection of signals for detection use a phase $\Delta\theta$ given by a relational expression:

$$\Delta\theta = 2\pi \cdot \Delta f \cdot T$$

using the difference $\Delta f$ between the frequency altered by the frequency altering means and a reference frequency, and a time period T from the start of applying the RF magnetic field to the start of detection of magnetic resonance signals.

Another aspect of the invention to solve the problem noted above constitutes an MRI apparatus including: signal collecting means which detects and collects magnetic resonance signals generated by applying a magnetostatic field, a gradient magnetic field and an RF magnetic field onto an object; frequency altering means which alters the frequency of the RF magnetic field and the frequency of signals for detection use in accordance with change in the Larmor frequency with time; and image reconstructing means which reconstructs an image on the basis of the collected signals, the MRI apparatus comprising frequency alteration control means which so alters the alteration of the frequency of signals for detection use by the frequency altering means as to make the phase at the time of starting detection continuous.

It is preferable, from the viewpoint of appropriately obtaining a reference frequency, for the reference frequency to be the Larmor frequency before change with time.

It is preferable, from the viewpoint of appropriately obtaining the initial value of the Larmor frequency, for the Larmor frequency before change with time to be measured from a magnetic resonance signal obtained by pre-scanning by the signal collecting means.

It is preferable, from the viewpoint of obtaining an appropriate measurement, for the Larmor frequency to be measured from an FID signal.

It is preferable, from the viewpoint of obtaining an image regarding a function, for the image reconstructing means to reconstruct an image by using signals having gone through mutual computation of signals of the same region differing in the time of collection.

It is preferable, from the viewpoint of obtaining a differential image, for the computation to be differential computation.

It is preferable, from the viewpoint of obtaining a contrast image, for one of the signals of the same region differing in the time of collection to be a signal before the injection of a contrast medium and the other to be a signal after the injection of the contrast medium.

According to one aspect of the present invention, since the MRI apparatus is an MRI apparatus including: signal collecting means which detects and collects magnetic resonance signals generated by applying a magnetostatic field, a gradient magnetic field and an RF magnetic field onto an object; frequency altering means which alters the frequency of the RF magnetic field and the frequency of signals for detection use in accordance with change in the Larmor frequency with time; and image reconstructing means which reconstructs an image on the basis of the collected signals, and comprises phase control means which sets as the phase at the time of starting detection of signals for detection use a phase $\Delta\theta$ given by a relational expression $\Delta\theta = 2\pi \cdot \Delta f \cdot T$ using the difference $\Delta f$ between the frequency altered by the frequency altering means and a reference frequency, and a time period T from the start of applying the RF magnetic field to the start of detection of magnetic resonance signals, it can eliminate phase deviation of detection signals due to the alteration of the frequencies of the RF magnetic field and signals for detection use.

According to another aspect of the present invention, since the MRI apparatus is an MRI apparatus including: signal collecting means which detects and collects magnetic resonance signals generated by applying a magnetostatic field, a gradient magnetic field and an RF magnetic field onto an object; frequency altering means which alters the frequency of the RF magnetic field and the frequency of signals for detection use in accordance with change in the Larmor frequency with time; and image reconstructing means which reconstructs an image on the basis of the collected signals, and comprises frequency alteration control means which so alters the alteration of the frequency of signals for detection use by the frequency altering means as to make the phase at the time of starting detection continuous, it can eliminate phase deviation of detection signals due to the alteration of the frequencies of the RF magnetic field and signals for detection use.

Further objects and advantages of the present invention will be apparent from the following description of the preferred embodiments of the invention as illustrated in the accompanying drawings.

BRIEF DESCRIPTION OF THE DRAWINGS

FIG. 6 is a time chart showing one example of alteration of the excitation frequency and the detection frequency.

FIG. 7 is a time chart showing another example of alteration of the excitation frequency and the detection frequency.

DETAILED DESCRIPTION OF THE INVENTION

Figure 1:
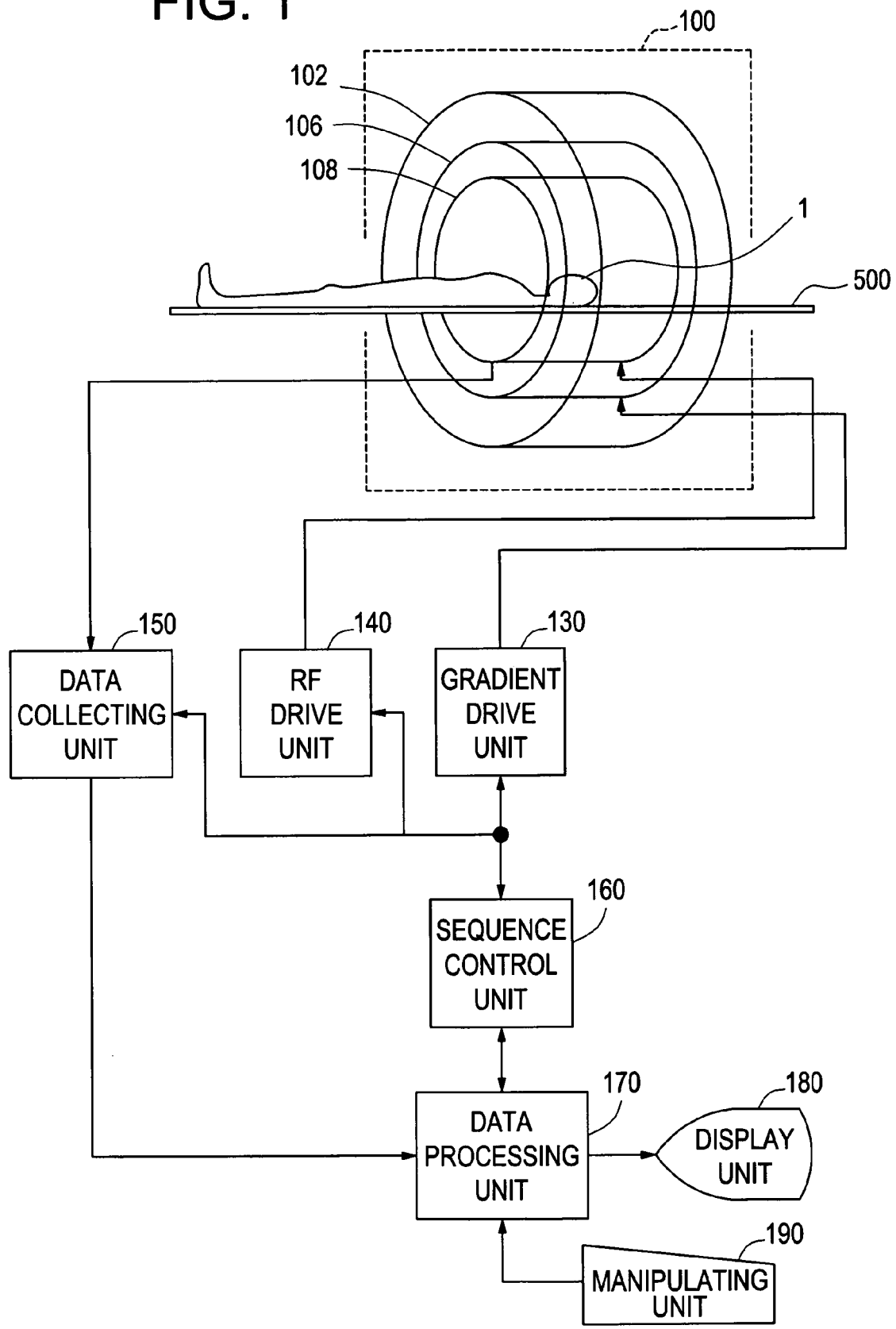
FIG. 1 is a block diagram of one example of MRI apparatus in the best mode for carrying out the present invention.

The best mode for carrying out the invention will be described in detail below with reference to drawings. Incidentally, the present invention is not confined to the best mode for carrying out the invention. A block diagram of an MRI apparatus is shown in FIG. 1. This apparatus is one example of the best mode for carrying out the invention. The configuration of this apparatus represents one example of the best mode for carrying out the present invention regarding an MRI apparatus.

As shown in the drawing, this apparatus has a magnet system 100. The magnet system 100 has a main magnetic field coil part 102, a gradient coil part 106 and an RF coil part 108. These coil parts are substantially cylindrically shaped, and arranged coaxially with one another.

An object 1 of imaging, mounted on a cradle 500, is carried in and out of the substantially columnar bore of the magnet system 100 by carrier means not shown.

The main magnetic field coil part 102 forms a magnetostatic field in the bore of the magnet system 100. The direction of the magnetostatic field is substantially parallel to the direction of the body axis of the object 1. Thus, there is formed a so-called horizontal magnetic field. The main magnetic field coil part 102 is configured of, for instance, superconducting coil. It need not be a superconducting coil, but may as well be configured of a normal conducting coil. Also, a magnet system of a perpendicular magnetic field type, whose magnetostatic field is perpendicular to the body axis of the object 1, may be used instead of the horizontal magnetic field. In the perpendicular magnetic field type, a permanent magnet, for instance, is used for generating the magnetostatic field.

The gradient coil part 106 generates, in the directions of three mutually perpendicular axes, namely the slice axis, the phase axis and the frequency axis, three gradient magnetic fields to give gradients to the magnetostatic field intensity.

Where coordinate axes perpendicular to one another in a magnetostatic field space are represented by x, y and z, any of these axes can be made the slice axis. In that case, one of the remaining two axes is made the phase axis and the other, the frequency axis. It is also possible to give any inclination to the slice axis, the phase axis and the frequency axis relative to the x, y and z axes while maintaining their mutual perpendicularity. In this apparatus, the direction of the body width of the object 1 is supposed to the x direction, that of the body thickness, the y direction and that of the body axis, the z direction.

The gradient magnetic field in the direction of the slice axis is also referred to as the slice gradient magnetic field. The gradient magnetic field in the direction of the phase axis is also referred to as the encode gradient magnetic field. The gradient magnetic field in the direction of the frequency axis is also referred to as the read out gradient magnetic field. The read out gradient magnetic field is synonymous to the frequency encode gradient magnetic field. To enable such gradient magnetic fields to be generated, the gradient coil part 106 has gradient coils of three lines not shown. Hereinafter, the gradient magnetic field may be simply referred to as the gradient.

The RF coil part 108 forms an RF magnetic field in the magnetostatic field space to excite spins in the body of the object 1. Hereinafter, the formation of the RF magnetic field may also be referred to as transmission of an RF excitation signal. The RF excitation signal may also be referred to as the RF pulse.

The electromagnetic wave generated by the excited spin, namely magnetic resonance signals, is received by the RF coil part 108. The magnetic resonance signals serve as sampling signals with respect to the frequency domain, namely the Fourier space.

If magnetic resonance signals are encoded on two axes by the gradients in the direction of the phase axis and in the direction of the frequency axis, the magnetic resonance signals will be obtained as sampling signals with respect to the two-dimensional Fourier space, or if they are encoded on three axes by using the slice gradient as well, they will be obtained as signals with respect to the three-dimensional Fourier space. The gradients determine the sampling positions of signals in the two-dimensional or three-dimensional Fourier space. Hereinafter, the Fourier space may also be referred to as the k-space.

A gradient drive unit 130 is connected to the gradient coil part 106. The gradient drive unit 130 gives a drive signal to the gradient coil part 106 to generate a gradient magnetic field. The gradient drive unit 130 has three lines of drive circuits not shown matching the three lines of gradient coils in the gradient coil part 106.

An RF drive unit 140 is connected to the RF coil part 108. The RF drive unit 140 gives a drive signal to the RF coil part 108 to have an RF pulse transmitted to excite a spin in the body of the object 1.

A data collecting unit 150 is also connected to the RF coil part 108. The data collecting unit 150 collects receive signals received by the RF coil part 108 as digital data.

A sequence control unit 160 is connected to the gradient drive unit 130, the RF drive unit 140 and the data collecting unit 150. The sequence control unit 160 controls the gradient drive unit 130 or the data collecting unit 150 to accomplish collection of magnetic resonance signals. Hereinafter, the collection of magnetic resonance signals may as well be referred to as scanning.

The sequence control unit 160 is configured of a computer or the like. The sequence control unit 160 has a memory not shown. The memory stores programs for the sequence control unit 160 and various sets of data. The function of the sequence control unit 160 is realized by the execution by the computer of a program stored in the memory. The part consisting of the magnet system 100 or the sequence control unit 160 constitutes one example of signal collecting means in the present invention.

The output side of the data collecting unit 150 is connected to a data processing unit 170. Data collected by the data collecting unit 150 are inputted to the data processing unit 170. The data processing unit 170 is configured of, for instance, a computer or the like. The data processing unit 170 has a memory not shown. The memory stores programs for the data processing unit 170 and various sets of data.

The data processing unit 170 is connected to the sequence control unit 160. The data processing unit 170 is positioned superior to and has general control over the sequence control unit 160. The function of this apparatus is realized by the execution by the data processing unit 170 of a program stored in the memory.

The data processing unit 170 stores into the memory the data collected by the data collecting unit 150. A data space is formed within the memory. This data space matches the k-space. The data processing unit 170 reconstructs an image by subjecting the data in the k-space to inverse Fourier transform. The data processing unit 170 represents one example of image reconstructing means in the present invention.

A display unit 180 and a manipulating unit 190 are connected to the data processing unit 170. The display unit 180 is configured of a graphic display or the like. The manipulating unit 190 is configured of a keyboard or the like equipped with a pointing device.

The display unit 180 displays reconstructed images and various items of information outputted from the data processing unit 170. The manipulating unit 190 is manipulated by the user to input various instructions, information and the like to the data processing unit 170. The user can manipulate this apparatus interactively through the display unit 180 and the manipulating unit 190.

Figure 2:
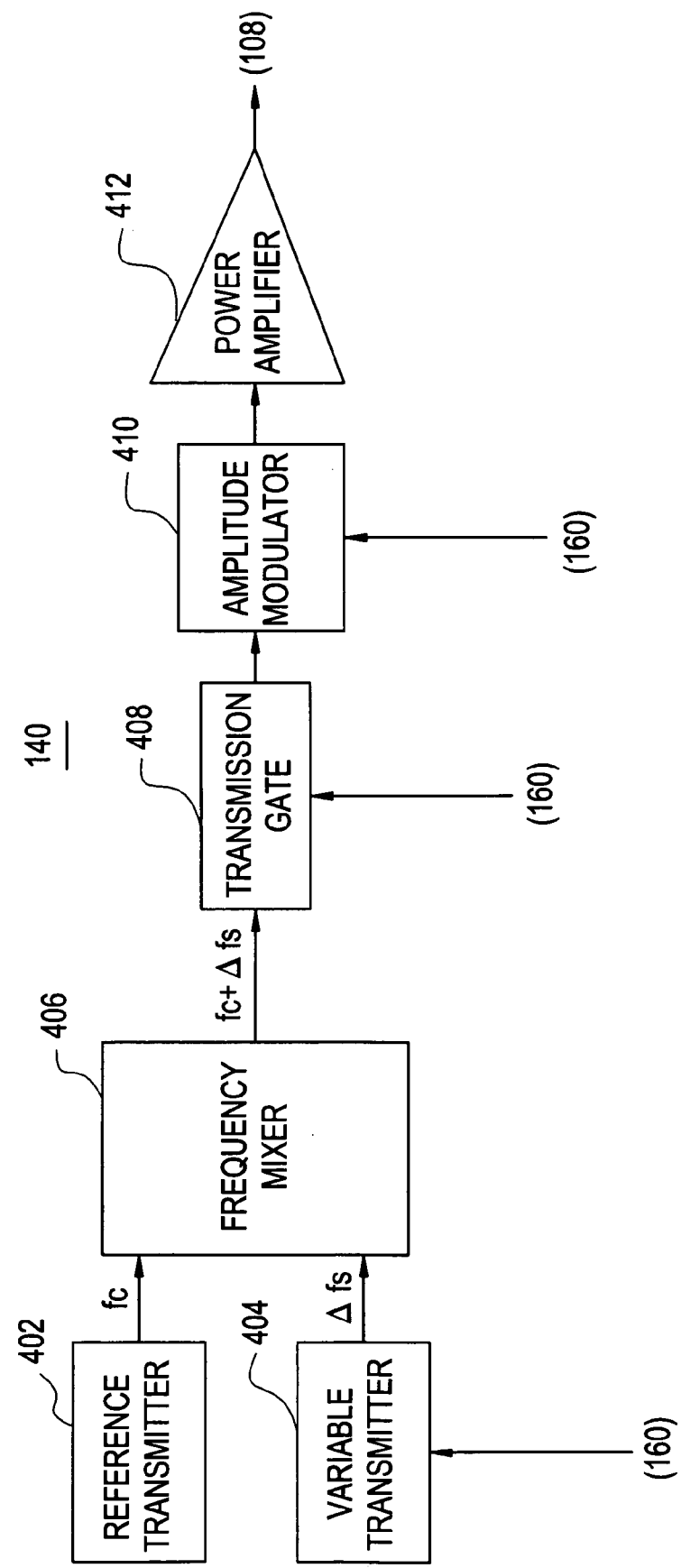
FIG. 2 is a block diagram of the RF drive unit.

FIG. 2 shows the configuration of the RF drive unit 140. As shown in this drawing, the RF drive unit 140 mixes the output signal (frequency fc) of a reference transmitter 402 and the output signal (frequency Δfs) of a variable transmitter 404 with a frequency mixer 406 to obtain an RF signal whose frequency is fc+Δfs, inputs this RF signal to an amplitude modulator 410 via a transmission gate 408, amplifies the RF signal of an amplitude-modulated wave with a power amplifier 412, and supplies the signal to the RF coil part 108.

The frequency fc of the output signal of the reference transmitter 402 is fixed. This frequency fc is equal to the Larmor frequency when the magnetostatic field intensity is at a regular level. Hereinafter, the frequency of the output signal of the reference transmitter may also be referred to as the frequency of the reference transmitter or the reference frequency. The reference frequency may be a pre-measured Larmor frequency before change with time. The Larmor frequency before change with time is measured from, for instance, magnetic resonance signals obtained by pre-scanning.

The frequency Δfs of the output signal of the variable transmitter 404 is altered under control by the sequence control unit 160. The variable transmitter 404 is one example of frequency altering means in the present invention. Hereinafter, the frequency of the output signal of the variable transmitter may also be referred to as the frequency of the variable transmitter. The opening and closing of the transmission gate 408 is also controlled by the sequence control unit 160.

Figure 3:
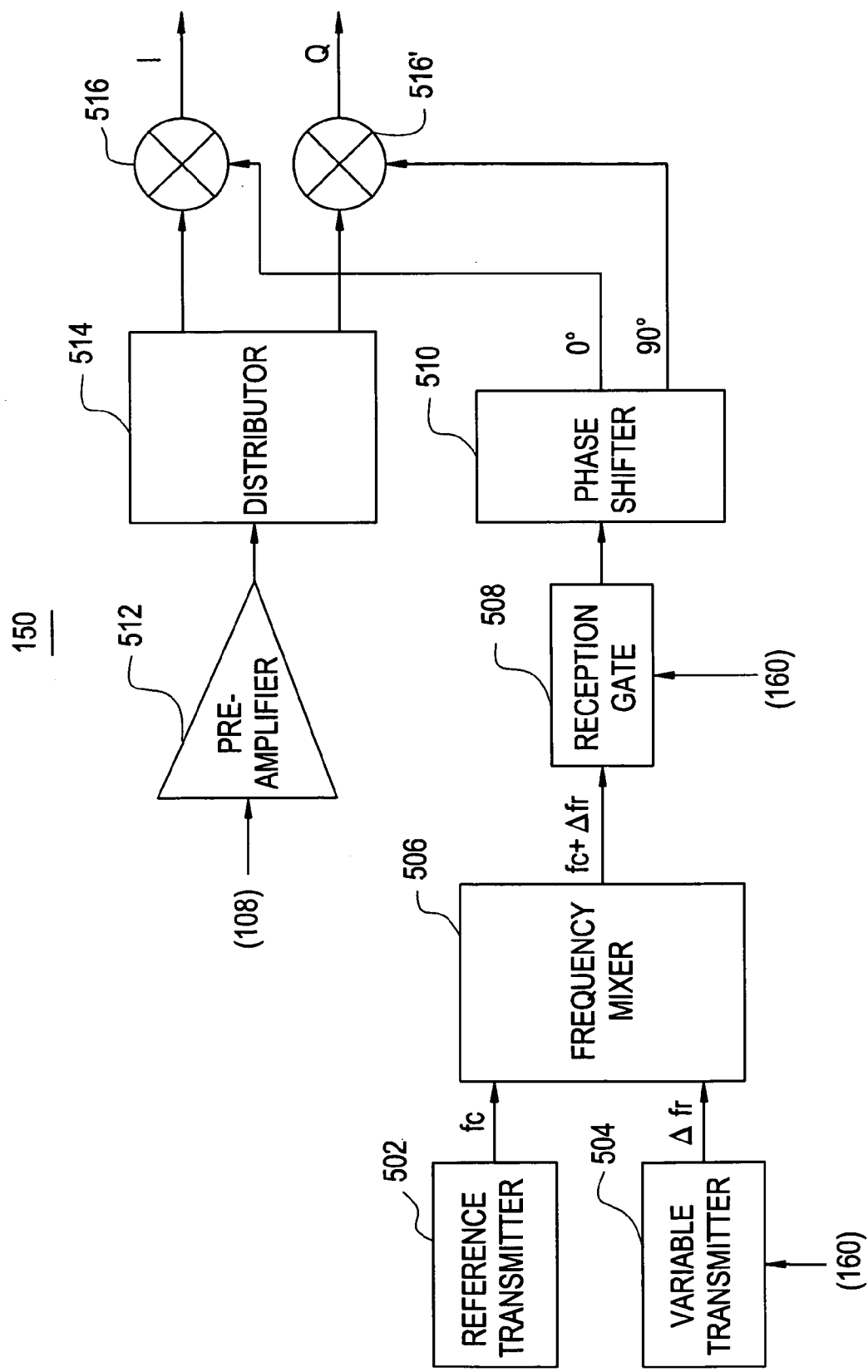
FIG. 3 is a block diagram of the front end part of the data collecting unit.

FIG. 3 shows the configuration of the front end part of the data collecting unit 150. As shown in the drawing, the data collecting unit 150 amplifies input signals from the RF coil part 108 with a pre-amplifier 512, and inputs them to two detectors 516 and 516' through a distributor 514 to obtain detected outputs I and Q.

Regarding signals (carrier) for detection by the detectors 516 and 516', the output signal (frequency fc) of a reference transmitter 502 and the output signal (frequency Δfr) of a variable transmitter 504 are mixed by a frequency mixer 506 to obtain a signal for detection use of fc+Δfr in frequency, and this signal for detection use is inputted to a phase shifter 510 through a reception gate 508 to obtain two signals for detection use, whose phases are 0° and 90°, from the phase shifter 510.

While the frequency fc of the reference transmitter 502 is fixed, the frequency Δfr of the variable transmitter 504 is varied under control by the sequence control unit 160. The variable transmitter 504 is one example of frequency altering means in the present invention. The frequency Δfr of the variable transmitter 504 is the same frequency as or a different frequency from the frequency Δfs of the variable transmitter 404. The opening and closing of the reception gate 508 is also controlled by the sequence control unit 160.

Figure 4:
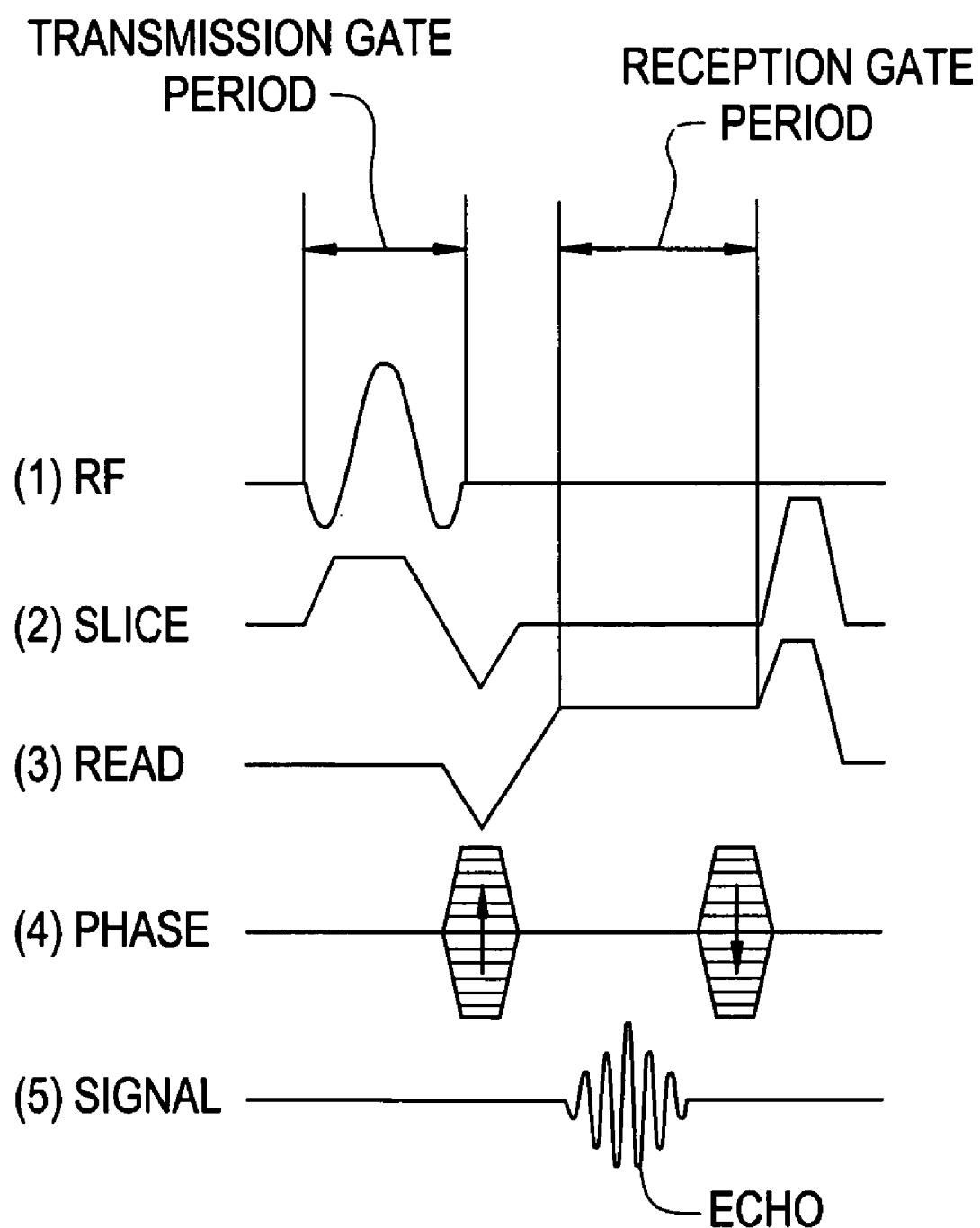
FIG. 4 is a chart showing one example of pulse sequence.

FIG. 4 shows one example of pulse sequence for scanning. This pulse sequence is a pulse sequence by the Gradient Echo method.

In the drawing, (1) shows the sequence of RF excitation. Every one of (2) through (4) shows the sequence of a gradient magnetic field; (5) shows the sequence of a magnetic resonance signal. Out of the sequences of the gradient magnetic field, (2) is the slice gradient, (3), the frequency encode gradient and (4), the phase encode gradient. Incidentally, the magnetostatic field is constantly applied at a fixed magnetic field intensity. The same applies hereinafter.

First, spin excitation by an α° takes place. The α° excitation is a selected excitation under the slice gradient Slice. The α° pulse is provided while the transmission gate 408 is open. Hereinafter, this period may also be referred to as the transmission gate period.

After the α° excitation, a frequency encode gradient Read and a phase encode gradient Phase are applied in a prescribed sequence, and magnetic resonance signals, namely echoes, are read out. The reading of echoes is continued as long as the reception gate 508 is open. Hereinafter, this period may also be referred to as the reception gate period.

When such a pulse sequence is repeated a prescribed number of times during a time of repetition TR, an echo is read out each time. Each time of repetition, the phase encoding of the echo is altered, and by repeating it a prescribed number of times the collection of echo signals over the whole two-dimensional k-space is accomplished. Incidentally, phase encoding is to be accomplished in the slice direction as well, echo signals are collected in the three-dimensional k-space. By subjecting echo data in the two-dimensional k-space to two-dimensional inverse Fourier transform, a 2D image is reconstructed. By subjecting echo data in the three-dimensional k-space to three-dimensional inverse Fourier transform, a 2D image is reconstructed.

Figure 5:
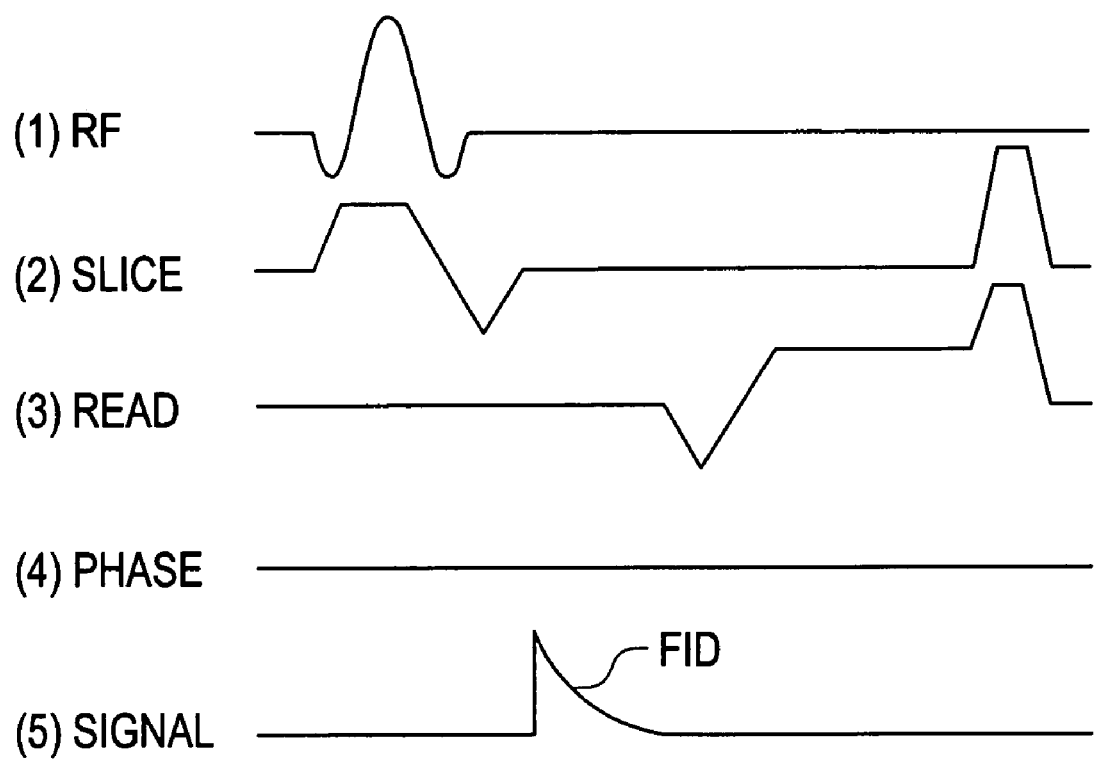
FIG. 5 is a chart showing one example of pulse sequence.

FIG. 5 shows one example of pulse sequence for FID signal collection. In the drawing, (1) shows the sequence of RF excitation. Every one of (2) through (4) shows the sequence of a gradient magnetic field. (5) shows a sequence of FID signals. As shown in the drawing, collection is carrier in a pulse sequence of which the phase encode gradient Phase is 0.

Such a pulse sequence is repeated at a prescribed frequency in a form of interrupting into the repetition of the pulse sequence for scanning shown in FIG. 4, and every time of interrupt an FID signal is collected. Every time an FID signal is collected, its center frequency is measured. The current value of the Larmor frequency is thereby obtained.

The frequency of RF excitation in the pulse sequence for scanning is so altered as to become identical with the current value of the Larmor frequency. The alteration of the RF excitation frequency is accomplished by having the sequence control unit 160 control the frequency $\Delta fs$ of the variable transmitter 404.

The carrier frequency for echo signal detection is also altered following the change in the Larmor frequency. The alteration of the carrier frequency is accomplished by having the sequence control unit 160 control the frequency $\Delta fr$ of the variable transmitter 504. Hereinafter, the RF excitation frequency may also be referred to as the excitation frequency, and the carrier frequency for echo signal detection, as the detection frequency.

FIG. 6 shows one example of alteration of the excitation frequency and the detection frequency in a time chart. In the chart, (1) shows the excitation frequency and (2), the detection frequency. However, every frequency is shown in terms of the frequency $\Delta fs$ of the variable transmitter 402 or the frequency $\Delta fr$ of the variable transmitter 502. fc+$\Delta fs$ and fc+$\Delta fr$ resulting from the addition of the frequencies fc of the reference transmitters 402 and 502 to these frequencies are the actual excitation frequency and detection frequency, respectively.

As shown in the chart, the excitation frequency is altered at a point of time t0 matched with the beginning of the transmission gate period, and the RF excitation is performed at the altered frequency. The amplitude of the RF excitation signal becomes the greatest at a point of time t1, and the transmission gate period ends at a point of time t2.

The excited spin rotates at the frequency fc+$\Delta fs$. Such a rotation becomes a rotation whose frequency is $\Delta fs$ on rotational coordinates of the frequency fc. For this reason, the time chart of the excitation frequency $\Delta fs$ in the drawing shows the behavior of the spin on the rotational coordinates.

The phase of such a spin on the rotational coordinates is given by:

$$\Delta \theta = 2\pi \int_{t0} \Delta fs \cdot t dt \quad (1)$$

This phase represents a deviation in phase on the rotational coordinates.

This deviation in phase at a point of time t3 when the reception gate begins is:

$$\Delta \theta = 2\pi \int_{t0}^{t3} \Delta fs \cdot t dt = 2\pi \cdot \Delta fs \cdot T \quad (2)$$

The reception gate period begins at the point of time t3, and detection at the frequency $\Delta fr$ is performed by a point of time t4. Then, signals of the frequency $\Delta fr$ are so controlled as to make the phase at the point of time t3 to be identical with the phase given by Equation (2). Under phase control by such signals for detection, output signals after detection involve no deviation in phase on the rotational coordinates. The phase control is performed by the sequence control unit 160 on the variable transmitter 504. The sequence control unit 160 is one example of phase control means.

FIG. 7 shows another example of alteration of the excitation frequency and the detection frequency in a time chart. In the chart, (1) shows the excitation frequency and (2), the detection frequency. As shown in the chart, the excitation frequency is altered at the point of time t0 matched with the beginning of the transmission gate period, and the RF excitation is performed at the altered frequency.

At the point of time t0, the detection frequency $\Delta fr$ is also altered. This alteration is so accomplished to make $\Delta fr=\Delta fs$ hold. However, no detection with this signal is done because it is not yet the reception gate period.

The reception gate period begins at the point of time t3. Since the detection frequency during the reception gate period is determined according to the reception band, $\Delta fr=\Delta fs$ does not always hold. When $\Delta fr \neq \Delta fs$, the frequency is altered anew at the point of time t3. The frequency is then altered on a continuous phase basis. The detection frequency alteration on such a continuous phase basis is accomplished by the sequence control unit 160 upon the variable transmitter 504. The sequence control unit 160 is an example of frequency alteration n control means.

Since $\Delta fr=\Delta fs$ had held until immediately before the alteration, the phase at the point of time t3 is the phase given by Equation (2). For this reason, as in the case of FIG. 6, output signals after detection involve no deviation in phase on the rotational coordinates.

In this way, since the signals after detection involve no deviation in phase irrespective of change in the Larmor frequency with time, no error occurs even when the difference between before and after the injection of the contrast medium is to be figured out of signals of the same region differing in the time of collection at a raw data stage. Therefore, a correct contrast image can be obtained. To add, the same applies where some computation, not confined to the difference, is to be done of signals of the same region differing in the time of collection. A correct functional image or the like can be thereby obtained.

Many widely different embodiments of the invention may be configured without departing from the spirit and the scope of the present invention. It should be understood that the present invention is not limited to the specific embodiments described in the specification, except as defined in the appended claims.

The invention claimed is:

1. An MRI apparatus comprising:
    a signal collecting device which detects and collects magnetic resonance signals generated by applying a magnetostatic field, a gradient magnetic field and an RF magnetic field onto an object;
    a frequency altering device which alters the frequency of the RF magnetic field and the frequency of signals for detection use in accordance with change in Larmor frequency with time;
    an image reconstructing device which reconstructs an image on the basis of the collected signals; and
    a frequency alteration control device which so alters the alteration of the frequency of signals for detection use by said frequency altering device as to make the phase at the time of starting detection continuous.

2. The MRI apparatus according to claim 1, wherein:
said Larmor frequency is measured from an FID signal.

3. The MRI apparatus according to claim 1, wherein:
said image reconstructing device reconstructs an image by using signals having gone through mutual computation of signals of the same region differing in the time of collection.

4. The MRI apparatus according to claim 3, wherein:
said computation is differential computation.

5. The MRI apparatus according to claim 4, wherein:
one of said signals of the same region differing in the time of collection is a signal before the injection of a contrast medium and the other is a signal after the injection of the contrast medium.

6. An MRI apparatus including comprising:
a signal collecting device which detects and collects magnetic resonance signals generated by applying a magnetostatic field, a gradient magnetic field and an RF magnetic field onto an object;
a frequency altering device which alters the frequency of the RF magnetic field and the frequency of signals for detection use in accordance with change in the Larmor frequency with time;
an image reconstructing device which reconstructs an image on the basis of the collected signals; and
a phase control device which sets as the phase at the time of starting detection of signals for detection use a phase $\Delta\theta$ given by a relational expression:

$\Delta\theta = 2\pi \cdot \Delta f \cdot T$ using the difference $\Delta f$ between the frequency altered by said frequency altering device and a reference frequency, and a time period T from the start of applying the RF magnetic field to the start of detection of magnetic resonance signals.

7. The MRI apparatus according to claim 1, wherein:
said reference frequency is the Larmor frequency before change with time.

8. The MRI apparatus according to claim 7, wherein:
said Larmor frequency before change with time is measured from a magnetic resonance signal obtained by pre-scanning by said signal collecting device.

9. The MRI apparatus according to claim 1, wherein:
said Larmor frequency is measured from an FID signal.

10. The MRI apparatus according to claim 1, wherein:
said image reconstructing device reconstructs an image by using signals having gone through mutual computation of signals of the same region differing in the time of collection.

11. The MRI apparatus according to claim 10, wherein:
said computation is differential computation.

12. The MRI apparatus according to claim 11, wherein:
one of said signals of the same region differing in the time of collection is a signal before the injection of a contrast medium and the other is a signal after the injection of the contrast medium.

* * * * *